(12) United States Patent
Stockinger et al.

(10) Patent No.: US 7,209,332 B2
(45) Date of Patent: Apr. 24, 2007

(54) TRANSIENT DETECTION CIRCUIT

(75) Inventors: Michael Stockinger, Austin, TX (US); James W. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 745 days.

(21) Appl. No.: 10/315,796

(22) Filed: Dec. 10, 2002

(65) Prior Publication Data

US 2004/0109270 A1 Jun. 10, 2004

(51) Int. Cl.
*H02H 3/20* (2006.01)
(52) U.S. Cl. .................. 361/56; 361/18; 361/91.1; 361/111
(58) Field of Classification Search .......... 361/56, 361/18, 91.1, 111
See application file for complete search history.

(56) References Cited

U.S. PATENT DOCUMENTS

| | | | | |
|---|---|---|---|---|
| 5,222,146 A | * | 6/1993 | Bahl et al. .................. | 704/243 |
| 5,239,440 A | | 8/1993 | Merrill | |
| 5,287,241 A | | 2/1994 | Puar | |
| 5,323,067 A | * | 6/1994 | Shay .......................... | 327/142 |
| 5,440,162 A | | 8/1995 | Worley et al. | |
| 5,508,649 A | * | 4/1996 | Shay .......................... | 327/318 |
| 5,559,659 A | | 9/1996 | Strauss | |
| 5,731,739 A | | 3/1998 | Ho | |
| 5,744,842 A | * | 4/1998 | Ker ............................ | 257/362 |
| 5,825,601 A | | 10/1998 | Statz et al. | |
| 5,907,464 A | | 5/1999 | Maloney et al. | |
| 5,946,177 A | | 8/1999 | Miller et al. | |
| 5,978,192 A | * | 11/1999 | Young et al. ................ | 361/56 |
| 6,016,070 A | * | 1/2000 | Uehara ....................... | 327/176 |
| 6,198,138 B1 | | 3/2001 | Hirota | |
| 6,385,021 B1 | | 5/2002 | Takeda et al. | |
| 6,392,860 B1 | * | 5/2002 | Lin et al. .................... | 361/111 |
| 6,400,540 B1 | | 6/2002 | Chang | |
| 6,510,033 B1 | * | 1/2003 | Maloney et al. ............ | 361/111 |
| 6,566,715 B1 | * | 5/2003 | Ker et al. ................... | 257/355 |
| 6,643,109 B1 | * | 11/2003 | Li et al. ..................... | 361/56 |

(Continued)

FOREIGN PATENT DOCUMENTS

EP 0697757 A1 2/1996

(Continued)

OTHER PUBLICATIONS

W. Anderson et al., "Cross-Referenced ESD Protection for Power Supplies," EOS/ESD Symp. Proceedings, 1998, pp. 2A.5.1-2A.5. 10.

(Continued)

*Primary Examiner*—Brian Sircus
*Assistant Examiner*—Z Kitov
(74) *Attorney, Agent, or Firm*—David G. Dolezal; Susan C. Hill; Ranjeev Singh (57) ABSTRACT

A transient detection circuit which may be used in an electrostatic discharge (ESD) clamp circuit. The transient detection circuit includes a filter circuit and an inverter circuit. The voltage switch point of the inverter circuit has a constant voltage offset from one of the nodes. When a filtered voltage level from the filter circuit crosses the voltage switch point of the inverter circuit (indicative of an ESD event), the inverter circuit provides a signal indicating an ESD event.

26 Claims, 6 Drawing Sheets

U.S. PATENT DOCUMENTS

| | | | |
|---|---|---|---|
| 6,664,823 B2* | 12/2003 | Yokoi | 327/108 |
| 6,667,870 B1 | 12/2003 | Segervall | |
| 6,795,286 B2* | 9/2004 | Maloney et al. | 361/56 |
| 6,903,913 B2* | 6/2005 | Ker et al. | 361/111 |
| 6,912,109 B1 | 6/2005 | Ker et al. | |
| 6,927,957 B1* | 8/2005 | Bakulin et al. | 361/56 |

FOREIGN PATENT DOCUMENTS

| | | |
|---|---|---|
| EP | 0851552 A1 | 1/1998 |
| RU | 2071161 C1 | 12/1996 |
| SU | 1705947 A1 | 1/1992 |
| WO | WO 02/27795 A2 | 4/2002 |

OTHER PUBLICATIONS

S. Dabral et al., "Core Clamps for Low Voltage Technologies," EOS/ESD Symp. Proceedings, 1994, pp. 3.6.1-3.6.9.

Krasin, Alexander, PCT/RU02/00113 entitled "Circuit for Electrostatic Discharge Protection," filed Mar. 22, 2002.

R. Merril and E. Issaq, "ESD Design Methodology," EOS/ESD Symp. Proceedings, 1993, pp. 5B.5.1-5.B.5.5.

J. Miller et al., U.S. Appl. No. 10/216,336 entitled "Electrostatic Discharge Protection Circuitry and Method of Operation," filed Aug. 9, 2002.

c. Torres et al., "Modular, Portable, and Easily Simulated ESD Protection Networks for Advanced CMOS Technologies," EOS/ESD Symp. Proceedings, 2001.

E. Worley et al., "Sub-Micro Chip ESD Protection Schemes Which Avoid Avalanching Junctions," EOS/ESD Symp. Proceedings, 1995, pp. 1.2.1-1.2.8.

Ramirez-Angulo, J. et al., Programmable BICMOS Transconductor for Capacitor-Transconductor Filters, Electronics Letter, Jun. 18, 1992, pp. 1185-1187, vol. 28, No. 13, IEEE Stevenage, GB.

PCT/US 03/24469 International Search Report.

* cited by examiner

TRANSIENT DETECTION CIRCUIT

BACKGROUND OF THE INVENTION

1. Field of the Invention

This circuit relates in general to an electronic circuit and in particular to transient detection for an electronic circuit.

2. Description of the Related Art

An integrated circuit may be subjected to an Electrostatic Discharge (ESD) event during its manufacture, assembly, or testing, or during its ultimate system application. In conventional integrated circuit (IC) ESD protection schemes, special clamp circuits are often used to shunt ESD currents between the IC power supply rails and thereby protect sensitive internal circuitry from damage. A type of ESD clamp circuit, known as an active Metal Oxide Semiconductor Field Effect Transistor (MOSFET) clamp circuit, may contain three functional elements; a transient detection circuit, an on time control circuit, and a clamp switch which may include a large MOSFET. The transient detection circuit is designed to respond to the rapid rise time characteristic of an ESD event, typically 100 picoseconds to 60 nanoseconds, but remain inactive during normal operation of the IC. The on-time control circuit may be used to amplify the transient detection circuit output in order to fully turn on the large MOSFET into a low resistance conducting state. The on-time control circuit may also be used to hold the large MOSFET in this low resistance conducting state for a period of time, which typically exceeds the maximum expected duration of an ESD event, which is typically 500–1000 nanoseconds. The MOSFET connected between the two power supply rails acts as the primary ESD current dissipation device in the clamp circuit. Since the peak current in an ESD event is typically on the order of amperes, MOSFETs with channel widths of thousand of microns are typically used in order to achieve the desired low on-resistance between the two power supply rails.

Figure 1:
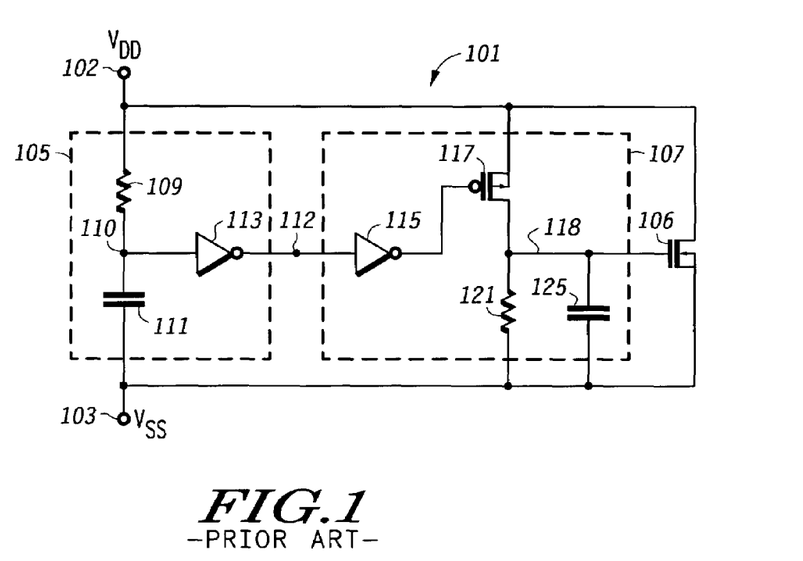
FIG. 1 is a circuit diagram of a prior art ESD clamp circuit.

FIG. 1 is a circuit diagram of a prior art ESD clamp circuit. The clamp circuit 101 protects a VDD power supply rail connected to node 102 from positive ESD events referenced to a grounded VSS power supply rail connected to node 103. Clamp circuit 101 includes a transient detection circuit 105, an on-time control circuit 107, and a clamp switch 106. Clamp switch 106 is shown configured as a large N-channel MOSFET, or NMOS transistor, with its source connected to node 103 and its drain connected to node 102. Alternate clamp circuit designs may utilize other types of switches such as, e.g., a P-channel MOSFET, or PMOS transistor, as the clamp switch.

Figure 2:
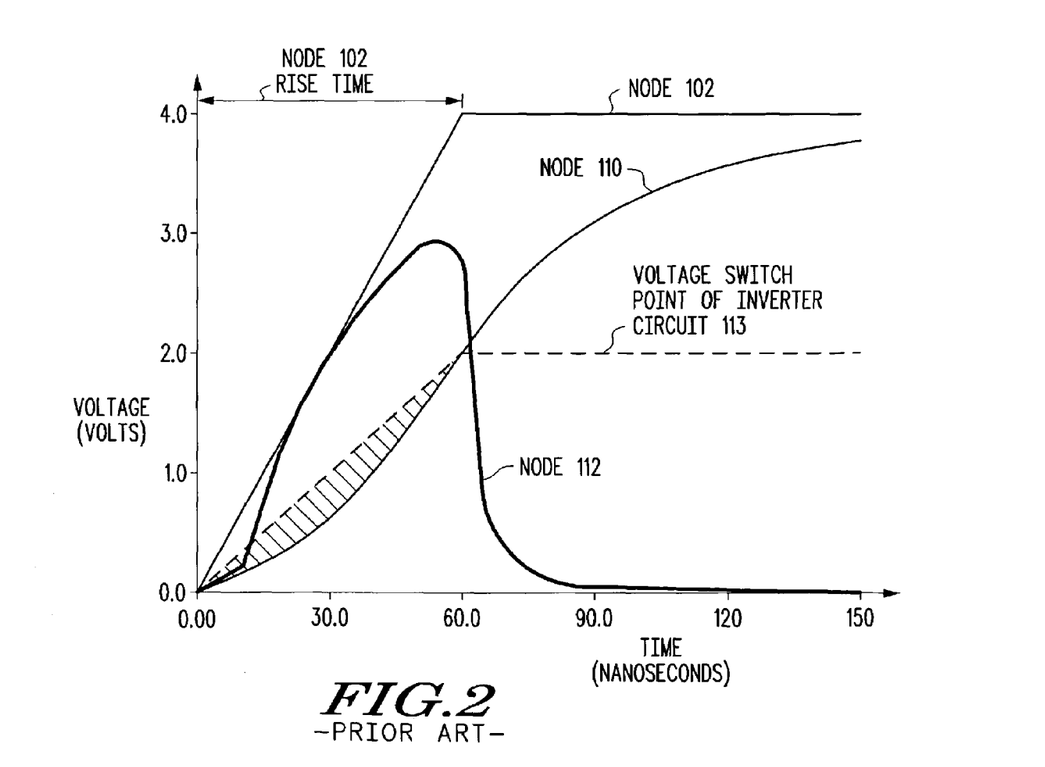
FIG. 2 is a diagram showing the operation of a prior art ESD clamp circuit in response to a simulated ESD event.

FIG. 2 is a diagram showing the operation of transient detection circuit 105 in response to a simulated ESD event applied to the power supply rail (VDD) connected to node 102 with node 103 grounded. The simulated ESD event induces on node 102 a linear voltage ramp from 0 volts (V) to 4V, with a rise time of 60 nanoseconds (ns). While a typical ESD event will not produce the perfectly linear voltage ramp on node 102 as shown in FIG. 2, the linear ramp is very useful for characterizing the transient response of transient detection circuit 105. Resistor 109 and capacitor 111 form a resistor-capacitor (RC) filter, such that node 110 will rise from 0 V towards the voltage of node 102 with a characteristic delay time controlled by the RC time constant for the filter. The RC time constant is the product of the resistance of resistor 109 and capacitance of capacitor 111. As shown in FIG. 2, during the rise time of node 102, node 110 asymptotically approaches, but for this brief rise time does not quite reach, a slew rate (slope) matching the slew rate of node 102. It can be shown that, when the slew rates for these two nodes match, the horizontal offset between node 102 and node 110 just equals the RC time constant for the filter. In the example shown in FIG. 1, the RC time constant is about 44 ns. This is less than the 60 ns rise time of node 102.

As shown in FIG. 1, node 110 serves as the input to an inverter circuit 113. Inverter circuit 113 may be a conventional CMOS inverter circuit consisting of an NMOS and a PMOS transistor in series (not shown) with their source terminals connected to nodes 103 and 102 respectively, and with their gate terminals connected to node 110. The drain terminals of both transistors are connected to node 112. In the following description, a "high" signal refers to a voltage level at or near the voltage level of node 102, whereas a "low" signal refers to a voltage level at or near the voltage of node 103 This nomenclature is used, for example, to indicate switching states of an inverter circuit. The voltage switch point of inverter circuit 113 is the input voltage threshold at which its output changes states. As can be seen in FIG. 2, the voltage switch point of inverter circuit 113, as shown by the dashed line labeled "voltage switch point of inverter circuit 113," is a constant fraction of the instantaneous voltage on node 102. With the circuit of FIG. 1, the NMOS and PMOS transistors in inverter circuit 113 are sized in the most common manner, so that the voltage switch point equals approximately one-half the instantaneous voltage on node 102.

The maximum ESD rise time is defined as the longest possible rise time of an ESD event that transient detection circuit 105 should properly detect. In the present example, this maximum ESD rise time is assumed equal to 60 ns, which is the rise time of node 102 shown in FIG. 2. While a maximum ESD rise time of 60 ns is assumed in the present example, other maximum ESD rise times (e.g. 20 ns) may be used depending on expected ESD rise time characteristics. With the circuit of FIG. 1, the RC time constant of transient detection circuit 105 has been intentionally adjusted so that the voltage at node 110 remains below the inverter circuit 113 voltage switch point for the full 60 ns. This can be seen in FIG. 2, where node 110 rises above the voltage switch point of inverter circuit 113 just at the end of the 60 ns rise time of node 102. The output of inverter circuit 113 (node 112) tracks node 102 (output high) for a portion of the rise time of node 102, only dropping to near VSS (output low) as the inverter circuit switches states at the 60 ns point. Note that, at the very beginning of the node 102 ramp, the output of inverter circuit 113 is not driven high until node 102 reaches about 0.65V. This is due to the fact that the inverter circuit functions in a weak conduction mode until node 102, which also serves as the power supply for inverter circuit 113, reaches the threshold voltage for the PMOS transistor in inverter circuit 113. During that time, the output impedance of inverter circuit 113 is very high and the voltage at its output node 112 is mainly determined by the parasitic capacitances connected to node 112.

The operation of on-time control circuit 107 in FIG. 1 can be described as follows. An ESD event detected by transient detection circuit 105 should produce a high signal at node 112 for the full rise time of the ESD event. With a high signal at node 112, inverter circuit 115 drives the gate of PMOS transistor 117 low. This turns on PMOS transistor 117 which then pulls node 118 up to node 102 (high), fully turning on the large NMOS transistor 106. NMOS transistor 106 serves as the primary ESD current shunting device between node 102 and node 103. At the end of the voltage ramp on node 102, the output of transient detection circuit 105 (node 112)

switches low and the output of inverter circuit 115 switches high. This makes PMOS transistor 117 nonconductive. Beyond this point in time, the voltage at node 118 will exponentially decay towards voltage of node 103 with an RC time constant set by the resistance of resistor 121 and capacitance between node 118 and node 103 provided by capacitor 125 and the gate capacitance of NMOS transistor 106. As the voltage at node 118 drops from the voltage of node 102 towards the voltage of node 103, NMOS transistor 106 will become increasingly resistive, until finally turning off as node 118 drops below the NMOS transistor threshold voltage at about 0.6V. The RC time constant for node 118 in on-time control circuit 107 may be adjusted so that NMOS transistor 106 conducts for a period of time at least equal to the maximum expected duration of an ESD event, here assumed to be 500–1000 ns.

Figure 3:
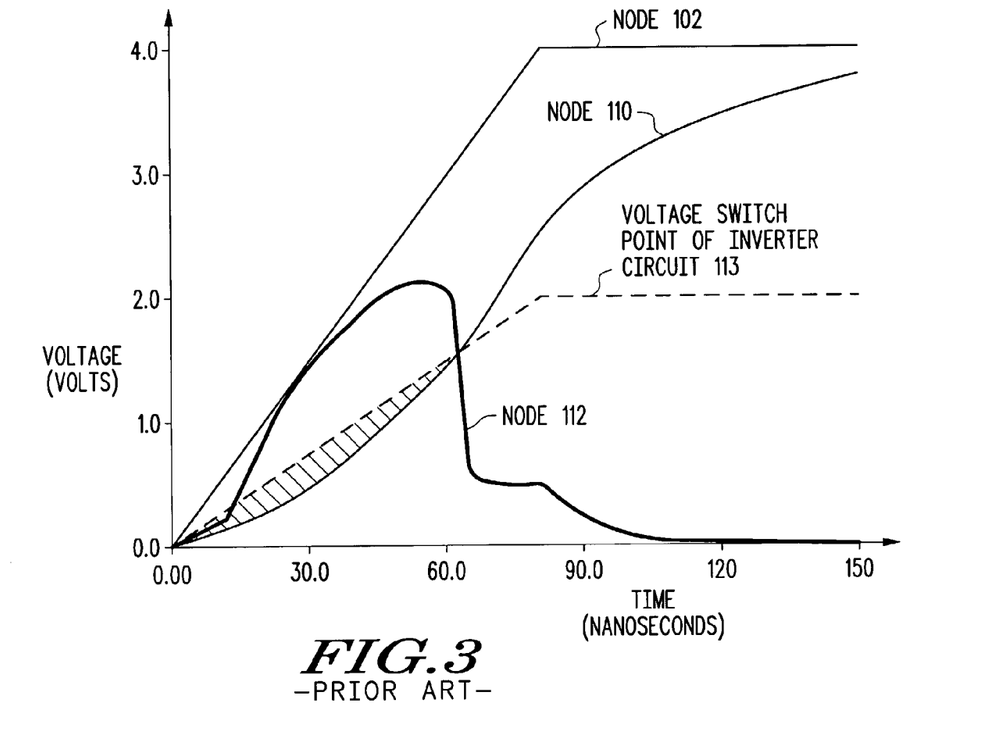
FIG. 3 is a diagram showing the operation of a prior art ESD clamp circuit in response to another simulated ESD event.

In the circuit of FIG. 1, transient detection circuit 105 was designed to provide a high signal at node 112 until the end of any voltage ramp on node 102 up to the defined maximum ESD rise time of 60 ns. For example if the ESD event induces on node 102 a voltage ramp with a rise time of less than 60 ns (e.g. 30 ns), a proper high signal would be provided at node 112 until the end of the ramp. However, for ESD induced voltage ramps on node 102 with rise time in excess of the 60 ns maximum ESD rise time, transient detection circuit 105 does not function in a proper manner. This is illustrated in FIG. 3 which shows a simulated linear voltage ramp at node 102 from 0 to 4 V with a rise time of 80 ns. As can be seen in FIG. 3, node 110 crosses above the voltage switch point of inverter circuit 113, and node 112 switches low, at about 60 ns, before the end of the voltage ramp. Whenever this early time-out of transient detection circuit 105 occurs, node 118 will not be charged to the full peak voltage of node 102 seen at the end of the voltage ramp. This results in an undesirable increased resistance in the NMOS transistor 106, due to the fact that the gate of transistor 106 is not fully charged to the peak voltage of node 102 bias point. This is defined as weak turn on of NMOS transistor 106. In addition, the on time of NMOS transistor 106 will be reduced for two reasons. First, since the transient detection circuit 105 times out before the end of the voltage ramp, on-time control circuit 107 will begin timing out from this earlier point in time. Second, since the voltage at node 118 never reaches the peak voltage of node 102, the RC decay time to VSS for node 118 is reduced significantly. Therefore, in order to function optimally in an ESD event, transient detection circuit 105 should be designed to provide a high signal at node 112 until the end of any voltage ramp of node 102 up to the defined maximum ESD rise time of 60 ns. Since the transient detection circuit 105 is designed to function properly for ESD induced voltage ramp times only up to the required maximum ESD rise time (60 ns), any weak turn-on of NMOS transistor 106 for slower ramp times is unnecessary and undesirable.

One consideration for transient detection circuit 105 is that, while it properly detects an ESD event on node 102 with a rise time up to the maximum ESD rise time, it must also not turn on NMOS transistor 106 during normal IC operation. This undesirable turn on during normal operation is called false triggering. Due to the typical large size of NMOS transistor 106, any false triggering of this device would cause significant undesirable leakage from node 102 to node 103. Of greatest concern during normal operation is the ramp-up (power-up) of the VDD power supply rail as power is applied to the IC. The minimum power-up rise time is defined as the shortest possible rise time of the VDD supply during normal IC operation in the intended application. If the linear ramp to 4 V in 80 ns on node 102 (connected to a VDD rail) as shown in FIG. 3 were induced not by an ESD event, but during normal power-up of the IC, there may be false triggering by NMOS transistor 106. This is due to the fact that node 112 is above the voltage switch point of inverter circuit 113 for a significant portion of the rise time.

Because the voltage switch point of inverter circuit 113 is proportional to the instantaneous voltage at node 102, and because capacitor 111 is initially discharged, the voltage level at node 110 will always be below the voltage switch point of inverter circuit 113 at the beginning of a any positive voltage ramp at node 102. This occurs both during faster rise time ESD events and during slower rise time power-up of the VDD power supply during normal integrated circuit operation. With the transient detection circuit of FIG. 1, false triggering during normal VDD power-up can only be avoided if the output node 112 of transient detection circuit 105 switches to low before the voltage of node 102 reaches an NMOS threshold voltage to turn on clamp switch 106. This means that the minimum power-up rise time needs to be much larger than the maximum ESD rise time of transient detection circuit 105 in order to prevent false triggering of NMOS transistor 106. For the prior art transient detection circuit 105 of FIG. 1, the minimum power-up rise time to avoid false triggering of clamp switch 106 is about 240 ns. Note that this is four times larger than the 60 ns target maximum ESD rise time of the circuit. The minimum power-up rise time of 240 ns, as stated above, does not take into account variations in transient detection circuit 105 performance under worst case temperature and manufacturing conditions. These limitations may further increase the minimum power-up rise time limitations for the integrated circuit.

Therefore, with the circuit of FIG. 1, there exists a large gap in permissible rise times between the maximum ESD rise time and the minimum power-up rise time. With increasing VDD rise times, starting from the maximum ESD rise time, detection circuit 105 continues to trigger, but fires more and more weakly, until the minimum power-up rise time is reached. For longer rise times beyond this point, no false triggering is observed. As stated previously, ESD clamp circuit 101 needs only respond to ESD events with rise times up to 60 ns. Any false triggering of the clamp circuit for longer rise times is both unnecessary and undesirable. The primary concern with the false triggering exhibited by the prior art ESD clamp circuit 101 is that it sets a limit on the minimum power-up rise time during normal operation. This may cause problems in certain IC applications e.g. where the VDD power supply may ramp up during normal operation with very fast rise times in the range of 200–500 ns. While in the majority of IC applications the minimum power-up rise time is typically in the range from microseconds to milliseconds, there are applications where very fast power-up rise times can occur. For example, in some smartcard and printer applications, the IC may be inserted into a powered-up printed circuit board or socket, resulting in a very rapid ramp-up of the VDD power supply rail. For these applications, an ESD clamp circuit is needed which exhibits a much shorter gap between the maximum ESD rise time and the minimum power-up rise time, than that exhibited by prior art ESD clamp circuit 101.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 4:
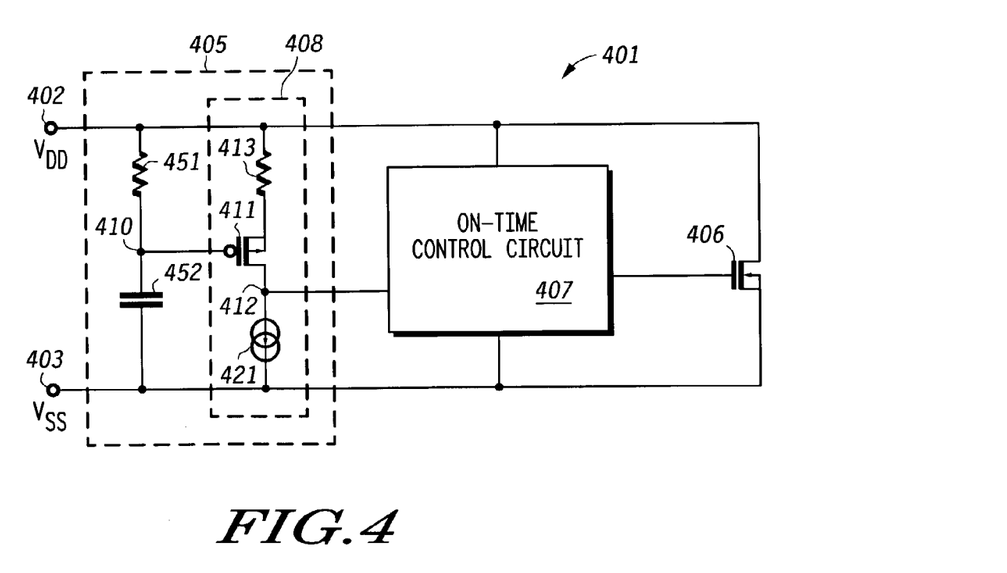
FIG. 4 is a circuit diagram of one embodiment of an ESD clamp circuit according to the present invention.

FIG. 4 is a circuit diagram of an ESD clamp circuit according to the present invention. Clamp circuit 401 protects node 402 from positive ESD events with respect to node 403. In the embodiment shown, nodes 402 and 403 are connected to a VDD power supply rail and a VSS power supply rail, respectively, of an integrated circuit chip. In other embodiments, nodes 402 and 403 may represent any two nodes in an integrated circuit.

Clamp circuit 401 includes a transient detection circuit 405, an on-time control circuit 407, and a clamp switch, which in the embodiment of FIG. 4 is implemented with an NMOS transistor 406. The source terminal of transistor 406 is connected to node 403 and the drain terminal connected to node 402. Transient detection circuit 405 is designed to sense a rapid slew rate of an ESD event at node 402 with respect to node 403, but remain inactive during normal operation of an IC implementing clamp circuit 401. In response to a detected ESD event, transient detection circuit 405 provides a high output signal via node 412 to on-time control circuit 407. In one embodiment, if the signal voltage at node 412 exceeds a characteristic trigger voltage of on-time control circuit 407, then the on-time control circuit turns on NMOS transistor 406, and holds it in a low resistance conducting state for a predetermined period of time (hold time), which, in one embodiment, is designed to be longer than the duration of a typical ESD event (500–1000 ns).

Transient detection circuit 405 includes an RC filter circuit (resistor 451 and capacitor 452) and an inverter circuit 408. The anode of resistor 451 connects to node 402 while the cathode connects to node 410. Node 410 also serves as the anode of capacitor 452 and the input to inverter circuit 408. The cathode of capacitor 452 is connected to node 403. Inverter circuit 408 includes a resistor 413, a PMOS transistor 411, and a current source 421, all connected in series between node 402 and node 403. The anode and cathode of resistor 413 connect to node 402 and to the source terminal of PMOS transistor 411, respectively. The body terminal of PMOS transistor 411 is shorted to the source terminal. The gate terminal of PMOS transistor 411 connects to node 410. The drain terminal of PMOS transistor 411 connects to node 412. Node 412 also serves as the anode of current source 421 and the output of transient detection circuit 405. The cathode of current source 421 is connected to node 403. In other embodiments, the filter circuit may have other configuration such as e.g., a multiple pole RC configuration or a resistor inductor capacitor (RLC) configuration.

Figure 5:
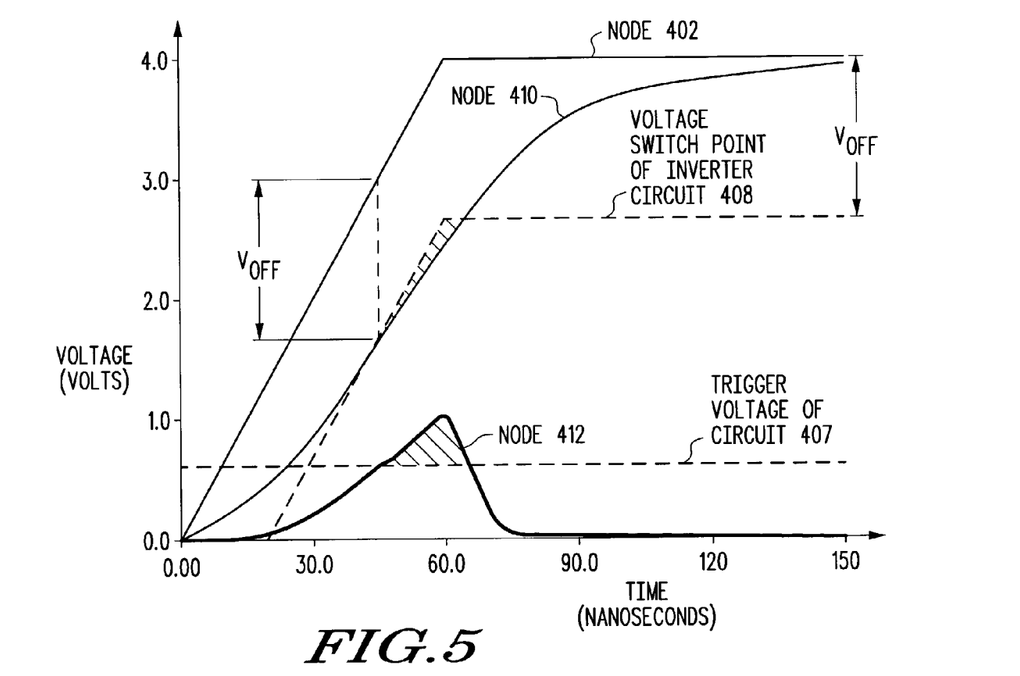
FIG. 5 is a diagram showing the operation of one embodiment of an ESD clamp circuit in response to a simulated ESD event according to the present invention.

FIG. 5 is a diagram showing the operation of transient detection circuit 405 in response to a simulated ESD event at node 402 with respect to node 403 inducing on node 402 a linear voltage ramp from 0 V to 4 V with a rise time equal to the maximum ESD rise time of circuit 401 (60 ns).

The voltage switch point of inverter circuit 408 during the simulated ESD event is shown by the dashed line labeled "voltage switch point of inverter circuit 408." As shown in FIG. 5, the voltage switch point of inverter circuit 408 is characterized by a constant vertical voltage offset (Voff) from node 402. This Voff is adjustable in the circuit design and, in this embodiment, equals 1.3V. Voff is generated by the sum of the voltage drops across resistor 413 and PMOS transistor 411. The voltage drop across resistor 413 is controlled by the current from current source 421. The voltage drop across PMOS transistor 411 is its gate to source voltage, which is slightly higher than the threshold voltage of PMOS transistor 411 to accommodate a drain to source current equal to the current provided by current source 421. The slew rate of the voltage switch point for inverter circuit 408 matches the slew rate of node 402. FIG. 4 is shown with an ideal current source 421 for providing a constant voltage offset Voff. In other embodiments, non ideal current sources may be used to provide a substantively constant voltage offset. Note also the differences in the voltage switch point characteristics between inverter circuit 113 from FIG. 1 (see FIG. 2), and inverter circuit 408 from FIG. 4 (see FIG. 5). The voltage switch point for inverter circuit 113 does not have a Voff and its slew rate is a constant fraction of the slew rate of the voltage of node 102. The voltage switch point for inverter circuit 408 exhibits a constant Voff, and a slew rate matching the slew rate of node 402. As will be shown below, these differences may affect the operation of a transient detection circuit in an ESD clamp circuit.

Referring back to FIGS. 4 and 5, during the rise time of the voltage of node 402, the RC filtered voltage at node 410 asymptotically approaches but does not quite reach, a slew rate matching the slew rate of the voltage at node 402, and accordingly, asymptotically approaches a slew rate matching the slew rate of the voltage switch point of inverter circuit 408. This may provide a detection strategy which may have many advantages over the prior art. One advantage of this strategy that may occur is that the difference between the maximum ESD rise time and the minimum power-up rise time, may be greatly reduced.

As shown in FIG. 5, the voltage at node 410 rises initially slower than the voltage at node 402 but asymptotically approaches a constant lateral offset from node 402. This offset is equal to the characteristic RC time constant for the filter, which, in the illustrated embodiment for the circuit of FIG. 4 is 26 ns. At the beginning of the voltage ramp at node 402, the voltage at node 410 is initially greater than the voltage switch point of inverter circuit 408, with the result that the output of transient detection circuit 405 (node 412) remains low. However, just past halfway into the voltage ramp of node 402, node 410 drops slightly below the voltage switch point of inverter circuit 408, causing node 412 to be pulled partially towards node 402. As node 412 is pulled above the trigger voltage of on-time control circuit 407 (shown as a dashed line in FIG. 5 labeled "trigger voltage of circuit 407"), a latch circuit of on-time control circuit 407 fires, pulling the gate of NMOS transistor 406 to the voltage of node 402. During the remainder of the voltage ramp of node 402, node 410 stays below the switch point of inverter circuit 408 until after the end of the voltage ramp. In addition, node 412 stays above the trigger voltage of on-time control circuit 407 to the end of the ramp as well.

Note that FIG. 5 illustrates the performance of transient detection circuit 405 right at the designed maximum ESD rise time. For faster rise time ESD events, node 412 will be pulled closer to the voltage of node 402, and spend a greater fraction of the total voltage ramp time above the trigger voltage of on-time control circuit 407. However, even in the 60 ns ramp time case illustrated in FIG. 5, NMOS transistor 406 is fully turned on, and safely dissipates the ESD current between node 402 and 403.

In contrast to node 110 of transient detection circuit 105, the voltage level at node 410 will always be above the voltage switch point of inverter circuit 408 at the beginning of any voltage ramp from 0V. Therefore, the output voltage of inverter circuit 408 at node 412 will initially be held at the voltage of node 403 and NMOS transistor 406 will not be turned on.

The combination of the voltage offset from node 402 in the voltage switch point of inverter circuit 408 and the nearly matched slew rates of node 410 and the voltage switch point of inverter circuit 408 may produce a circuit with far fewer false triggering problems in cases when the normal VDD power supply power-up time is only slightly larger than the maximum ESD rise time of the transient detection circuit. Accordingly, a transient detection circuit as described may be especially useful in integrated circuits having a fast VDD power-up rise time during normal circuit operation.

Figure 6:
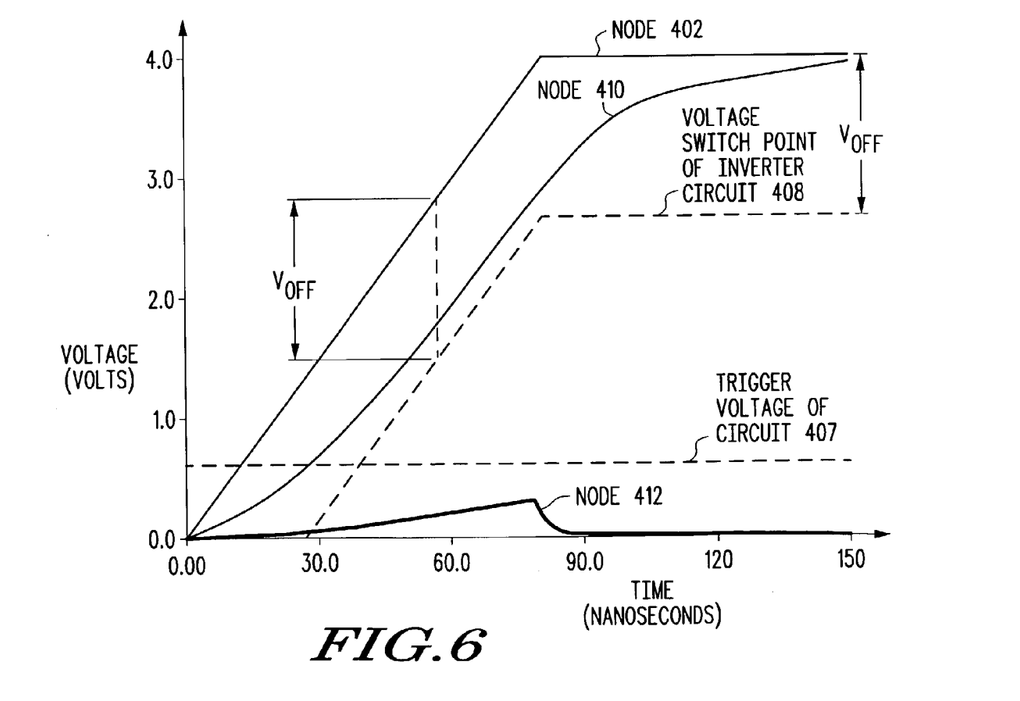
FIG. 6 is a diagram showing the operation of one embodiment of an ESD clamp circuit in response to a simulated power-up event according to the present invention.

FIG. 6 is a diagram showing the operation of detection circuit 405 during a simulated ESD event having a rise time of 80 ns, which is slightly greater than the maximum ESD rise time of circuit 405. Note that, during the voltage ramp, the voltage at node 410 never goes below the voltage switch point of inverter circuit 408, and therefore, the output of inverter circuit 408 (node 412) stays low. Consequently, NMOS transistor 406 never turns on. Therefore, a normal VDD power-up event with this slew rate would not result in false triggering of clamp circuit 401. Accordingly, the difference between the maximum ESD rise time where NMOS transistor 406 is fully turned on, and the minimum power-up rise time where NMOS transistor 406 is not turned on, is much less than that for circuit 101.

Another difference between transient detection circuit 105 and transient detection circuit 405 is that transient detection circuit 105 is a ramp time detector whereas transient detection circuit 405 is a true slew rate detector. Transient detection circuit 105 fully turns on if the rise time of the voltage at node 102 is less than 60 ns, independent of the maximum voltage on VDD if VDD is at least greater than a PMOS transistor threshold voltage. Transient detection circuit 405, on the other hand, turns on if the slew rate of the voltage at node 102 is greater than 4 V in 60 ns. The minimum ESD slew rate of transient detection circuit 405 is defined as the minimum slew rate of the voltage at node 402 which circuit 405 can properly detect as an ESD event. In the case of a linear voltage ramp of node 402, the minimum ESD slew rate is defined as the maximum ramp voltage on node 402 divided by the maximum ESD rise time.

In transient detection circuit 405, there is a relationship between the minimum ESD slew rate, the RC time constant, and the designed voltage offset (Voff) in inverter circuit 408. The voltage switch point of inverter circuit 408 includes a constant vertical voltage offset from node 402 and, therefore, during a voltage ramp on node 402, the slope of the voltage switch point matches the slope of the voltage of node 402. The input voltage of inverter circuit 408 (the voltage of node 410) includes a lateral time offset from node 402, which asymptotically approaches the RC time constant of resistor 451 and capacitor 452. Thus the slope of the input voltage of inverter circuit 408 approaches the slope of the voltage of node 402, which is also the slope of the voltage switch point of inverter circuit 408. At the minimum ESD slew rate of transient detection circuit 405, the voltage at node 410 just sinks below the inverter circuit switch point. The RC time constant is greater than the voltage offset (Voff) divided by the minimum ESD slew rate of transient detection circuit 405.

For the same maximum ESD rise time of 60 ns and maximum ramp voltage of 4 V, the RC time constant of transient detection circuit 105 is 44 ns and the RC time constant of transient detection circuit 405 is 26 ns, which is almost half of the time constant of circuit 105. Therefore, transient detection circuit 405 can be built with smaller RC components than transient detection circuit 105, which saves layout area on the chip. While the maximum ESD rise time of both circuits 105 and 405 can be adjusted by changing their RC time constants, inverter circuit 408 offers the additional ability to adjust the voltage offset (Voff) in its voltage switch point. If Voff was made smaller, for example, the RC time constant of circuit 405 could be further decreased.

As shown in FIG. 5 and FIG. 6, the voltage offset (Voff) of inverter circuit 408 provides detection circuit 405 with a voltage threshold below which inverter circuit 408 will not switch states. Clamp circuit 401 will not trigger until node 402 exceeds Voff. Therefore, transient detection circuit 405 combines a slew rate detector with a voltage threshold detector. Since Voff may be adjusted by varying resistor 413 or current source 421, detection circuit 405 may advantageously provide a circuit with the ability to avoid false triggering for IC applications even where the slew rate on node 402 during normal IC operation can reach that of an ESD event. For example, during normal IC operation, brief noise spikes, approaching 1 V or more in magnitude, may be superimposed on the normal VDD supply level. The ESD clamp circuit of FIG. 1 will typically suffer some degree of false triggering during these spikes. It may be an advantage of the circuit shown in FIG. 4 that false triggering is avoided by the voltage threshold capability of detection circuit 405. With Voff set to about 1.3V, in one example, noise spikes below this level will not induce any false triggering in clamp circuit 401. It is also possible to further increase the voltage offset (Voff), to a level higher than the normal VDD supply voltage. With Voff set in this manner, clamp circuit 401 will never turn on during power-up, independent of the power-up rise time. To provide good clamp circuit performance during an ESD event for transient detection circuits with high Voff, the RC time constant of transient detection circuit 405 may have to be increased to reduce turn-on delays during very fast (e.g. less than 5 ns) rise time ESD events.

An inverter circuit including a constant voltage offset can be implemented in ways other than that shown in FIG. 4. For example, a constant voltage source could be used instead of resistor 413, and current source 421 could be replaced by a resistive element. In another embodiment, an inverter circuit could utilize a differential amplifier with a voltage source equal to Voff connected to its positive differential input node and the negative differential input node serving as the input to the inverter circuit.

While the illustrated embodiment of transient detection circuit 405 serves the purpose of detecting an ESD event, it can also be used in other applications requiring the detection of a slew rate. For example, transient detection circuit 405 may be used where the slew rate of a signal needs to be detected without having an independent power supply available. With the embodiment of FIG. 4, the power required to operate transient detection circuit 405 is taken from the same voltage (the voltage between node 402 and 403) that is being detected.

Figure 7:
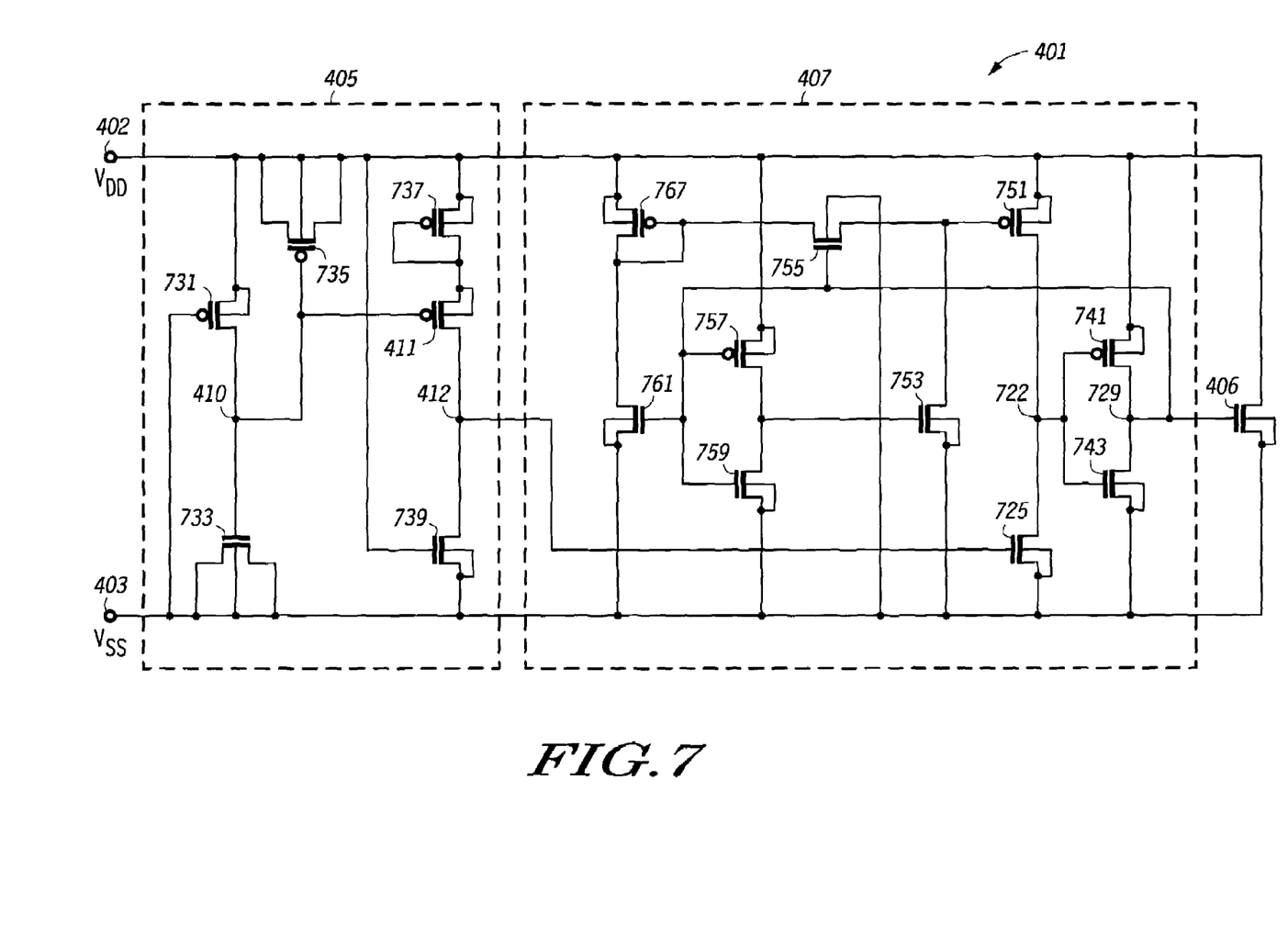
FIG. 7 is a circuit diagram of one embodiment of the ESD clamp circuit of FIG. 4 according to the present invention.

FIG. 7 is a circuit diagram of an embodiment of an implementation of clamp circuit 401 according to the present invention. In the embodiment of FIG. 7, the circuitry of clamp circuit 401 is implemented with NMOS and PMOS transistors only. In other embodiments, circuit 401 may be implemented by other types of devices or have other configurations as well.

In regard to transient detection circuit 405 as shown in FIG. 7, resistor 451 of FIG. 4 is implemented by PMOS transistor 731 configured as shown. Capacitor 452 is implemented with NMOS transistor 733. Resistor 413 is implemented with PMOS transistor 737, and current source 421 is implemented with NMOS transistor 739.

In the embodiment of FIG. 7, detection circuit 405 includes a transistor 735 configured to provide some pull up capacitance for node 410. The capacitance provided by transistor 735 is relatively small as compared to the capacitance provided by transistor 733. The capacitance of transistor 735 acts to smooth out the voltage at node 410 for the beginning part of a voltage ramp at node 402. Transistor 735 is not included in some embodiments of transient detection circuit 405.

FIG. 7 also shows one embodiment of an on-time control circuit 407. In response to an indication of an ESD event, on-time control circuit 407 turns on NMOS transistor 406 to provide a low resistance current path between node 402 and node 403 for a predetermined period of time (hold time). A voltage signal at node 412 that exceeds the threshold voltage of NMOS transistor 725 turns on transistor 725, which pulls node 722 low. Note that the threshold voltage of NMOS transistor 725 sets the trigger voltage of on-time control circuit 407, as defined earlier in FIG. 5. Pulling node 722 low causes output node 729 of the inverter circuit formed by transistors 741 and 743 to switch from low to high, thereby fully turning on NMOS transistor 406.

On-time control circuit 407 utilizes the intrinsic input capacitance of the inverter circuit formed by transistors 741 and 743 in providing a delay functionality to control the hold time of on-time control circuit 407. PMOS transistor 741 is relatively large in order to provide a high current to quickly charge the gate capacitance of the large NMOS transistor 406. For the circuit of FIG. 7, the gate capacitance of PMOS transistor 741 serves as an intrinsic capacitance between node 722 and node 402. In one embodiment, the MOSFET channel width of clamp transistor 406 is 1000 microns and the channel width of transistor 741 is 100 microns. However, other device sizes may be implemented to achieve a desired on-conductance of clamp transistor 406.

Once node 722 is pulled low, the gate capacitance of transistor 741 gets fully discharged. PMOS transistor 751, which is configured as a current source, serves to gradually charge the gate capacitance of transistor 741 in a somewhat linear manner, thereby raising the voltage of node 722. When the voltage level at node 722 rises above the voltage switch point of the inverter circuit formed by transistors 741 and 743, node 729 switches from high to low, thereby making NMOS transistor 406 nonconductive.

Utilizing the intrinsic input capacitance of an inverter circuit allows the on-time control circuit 407 to provide a delay function in controlling the conductivity of transistor 406 without including an additional (or a relatively large additional) capacitive structure. This allows on-time control circuit 407 to be achieved in less layout area. With some embodiments, a relatively small capacitive structure may be utilized to supplement the intrinsic input capacitance or to finely tune the hold time. This additional capacitive structure may be connected between node 722 and node 403 or between node 722 and node 402.

PMOS transistor 751, configured as a MOSFET current source, can provide two different levels of current, or equivalently two different charge rates of node 722, depending on the mode of operation. ESD mode occurs whenever the gate of NMOS transistor 406 is high resulting from an ESD event as detected by transient detection circuit 405. During ESD mode, the gate of PMOS transistor 751 is biased to produce a very small source to drain current (higher resistance). This makes it possible to achieve the desired charge rate of node 722, while implementing PMOSFET 751 in a fairly compact layout area. Non-ESD mode occurs whenever the gate of NMOS transistor 406 is low corresponding to any time before or after an ESD event and during all normal IC operation. During non-ESD mode, the gate of PMOS transistor 751 is biased to produce a much larger source to drain current (lower resistance). This effectively increases the discharge rate of node 722 and ensures that node 722 is held closely to node 402 to help prevent false triggering of NMOS transistor 406.

PMOS transistor 751 is biased for the two modes of operation as follows. During ESD mode, transistor 751 provides a low current level (higher resistance) to gradually discharge the gate capacitance of transistor 741, to achieve the desired delay time. In this mode of operation, transistor 755, which is configured as a transmission gate, connects the gate of transistor 751 to a biasing circuit formed by transistors 761 and 767, setting the current level of transistor 751. NMOS transistor 761 is configured as a current source with its gate connected to the gate of clamp switch transistor 406, which is high when on-time control circuit 407 has become active. Transistors 767 and 751 are configured as an asymmetric current mirror, which reduces the current provided by transistor 761. The hold time of on-time control circuit 407 can be controlled by tuning the level of discharge current provided by transistor 751, which can be accomplished by changing the sizes of transistors 761, 767, or 751.

After a detected ESD event, when on-time control circuit 407 has reached the end of its hold time, the non-ESD mode is entered. As the voltage at node 722 rises above the voltage switch point of the inverter circuit formed by transistors 741 and 743, node 729 and the gate of transistor 406 are pulled to node 403. However, at this point, node 722 is not fully charged up to node 402. Therefore, in order to quickly reset on-time control circuit 407 to its initial condition, transistor 751 changes to provide a higher current level (higher discharge rate) to quickly pull node 722 high. This ensures that the output of the inverter circuit formed by transistors 741 and 743 is low and NMOS transistor 406 is nonconductive. In this mode of operation, the gate of transistor 751 is pulled low by NMOS transistor 753. Transistor 753 is gated by an inverter circuit formed by transistors 757 and 759, which derives its input signal from node 729 (the gate of NMOS transistor 406). In this mode of operation, transmission gate transistor 755, is turned off.

The higher current level (higher discharge rate) of PMOS transistor 751 during non-ESD mode helps to quickly reset on-time control circuit 407 to its initial value after an ESD event. With node 722 held closely to node 402, it also helps to prevent false triggering of on-time control circuit 407 during normal ramp-up of the VDD power supply, and due to ringing or noise spikes on VDD which may occur during normal IC operation. The lower current level (lower discharge rate) of PMOS transistor 751 during ESD mode makes it possible to achieve the desired 1000 ns hold time of on-time control circuit 407, while implementing the discharge element in this delay circuit (PMOSFET 751) in a fairly compact layout area. Therefore on-time control circuit 407 comprises a delay circuit where the discharge element for a capacitive node can be configured in two states: a high discharge rate state to help prevent false triggering during normal IC operation, and a low discharge rate state to achieve the desired hold time during a detected ESD event, in a compact layout area. However in other embodiments, on-time control circuit 407 may be built with a fixed discharge rate.

In the embodiment of FIG. 7, on-time control circuit 407 is designed to provide a hold time of 1000 ns. However, shorter or longer hold times may be implemented as desired. In the embodiment shown, on-time control circuit 407 serves as a type of monostable latch circuit. A brief (or longer) voltage transition at node 412 above the trigger voltage of circuit 407 will result in a high output signal at node 729 for the defined hold time. At all other times, node 729 is held low. The hold time of on-time control circuit 407 is fairly independent of the on time of the signal at node 412, and fairly constant over the full range of ESD event slew rates.

In the embodiment of FIG. 4, clamp circuit 401 protects node 402 (the clamp circuit anode) from positive ESD events referenced to node 403 (the clamp circuit cathode). In one embodiment, nodes 402 and 403 are coupled to power supply pads of an IC chip. In alternate embodiments, nodes 402 and 403 are connected to internal power supply rails, with no external (off-chip) pad connections. Still in other embodiments, nodes 402 and 403 may represent any two nodes in an integrated circuit.

Figure 8:
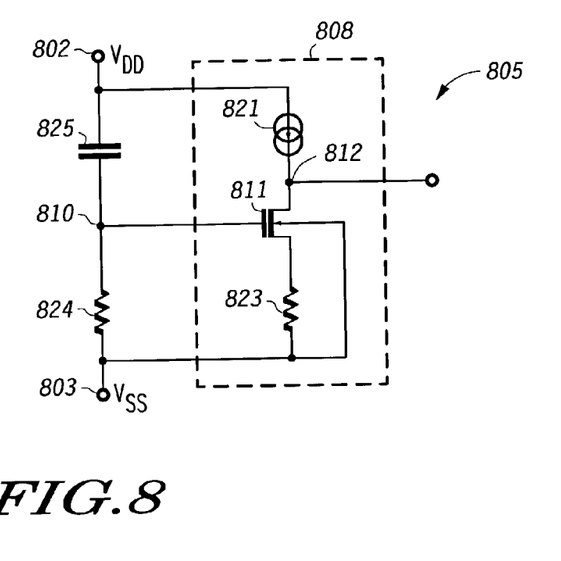
FIG. 8 is a circuit diagram of another embodiment of a transient detection circuit according to the present invention.

FIG. 8 shows another embodiment of a transient detection circuit according to the present invention. Transient detection circuit 805 resides between node 802 (e.g. a VDD power supply rail) and node 803 (e.g. a ground VSS power supply rail). Transient detection circuit 805 is different from the transient detection circuit 405 in that its inverter circuit 808 has a voltage switch point that includes a constant voltage offset (Voff) from node 803 rather than node 802. With circuit 805, the main components are flipped vertically (from the configuration of circuit 405) and PMOS transistor 411 is replaced by an NMOS transistor 811. In the embodiment of FIG. 8, the voltage offset from node 803 is generated by the voltage drop across resistor 823 and the gate to source voltage of NMOS transistor 811, wherein the voltage drop across resistor 823 is set by the current from current source 821. The RC filter circuit is formed by resistor 824 and capacitor 825. With circuit 805, resistor 824 is connected to node 803 and capacitor 825 is connected to node 802.

Figure 9:
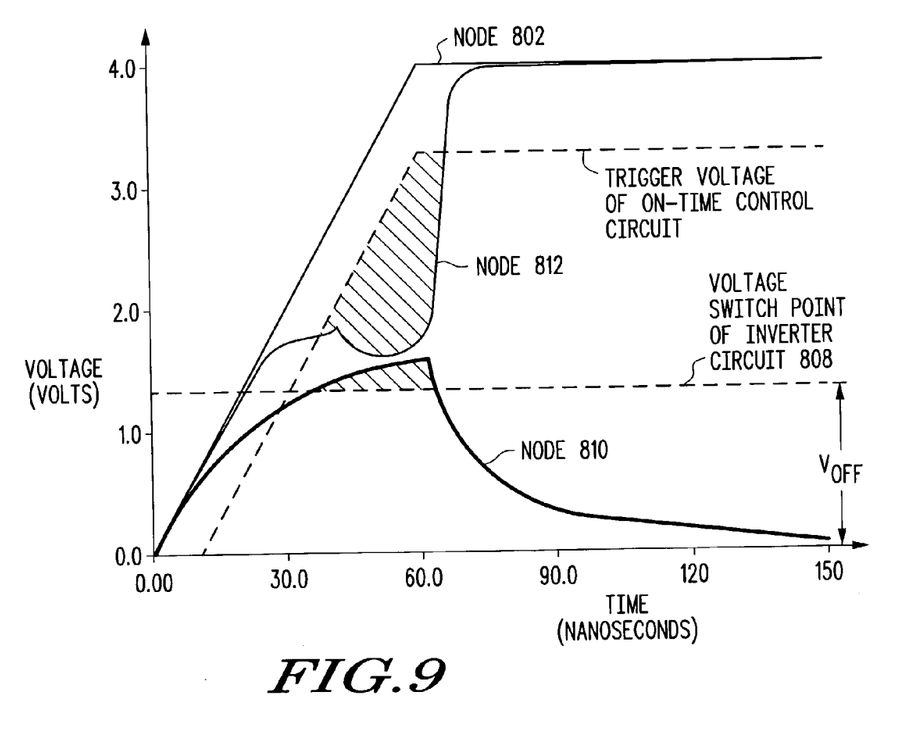
FIG. 9 is a diagram showing the operation of one embodiment of an ESD clamp circuit in response to a simulated ESD event according to the present invention.

FIG. 9 is a diagram showing the operation of transient detection circuit 805 in response to a simulated ESD event having a linear voltage ramp from 0 V to 4 V with a rise time equal to the maximum ESD rise time of 60 ns. As shown in FIG. 9, the voltage switch point of inverter circuit 808 (indicated by the dashed line in FIG. 9 labeled "voltage switch point of inverter circuit 808") has an offset (Voff) from node 803 of about 1.3V. During the voltage ramp, the filtered voltage at node 810 quickly rises and would settle to a constant voltage if the voltage ramp continued further in time. After the end of the voltage ramp, the voltage at node 810 decays exponentially and eventually approaches zero. The maximum voltage at node 810 is directly proportional to the slew rate of node 802. When the voltage level of node 810 rises above the voltage switch point of inverter circuit 808, circuit 808 pulls node 812 to a level below node 802 until the voltage at node 810 falls back below the voltage switch point of inverter circuit 808. This voltage drop at node 812 is used to indicate a detected ESD event. For those events having a slew rate less than the minimum ESD slew rate of circuit 805, the voltage level at node 810 never rises above the voltage switch point of inverter circuit 808 and node 812 stays high.

For an ESD clamp circuit (not shown) implementing transient detection circuit 805, an on-time control circuit (not shown) may have a trigger voltage as indicated by the dashed line in FIG. 9 labeled "trigger voltage of on-time control circuit." An example of such an on-time control circuit would be similar to on-time control circuit 407 except with all PMOS transistors replaced by NMOS transistors (and vice versa) and the circuit flipped vertically. The clamp switch (not shown in FIG. 8) connected to the on-time control circuit (not shown) may be either a PMOS transistor or an NMOS transistor. If the clamp switch is an NMOS transistor, an additional inverter circuit stage would need to be added to the on-time control circuit to provide a high signal at the gate of the NMOS transistor switch in case an ESD event is detected. Otherwise, such an embodiment of an on-time control circuit for transient detection circuit 805 would provide a low signal during an ESD event, suitable to drive the gate of a PMOS clamp switch.

Figure 10:
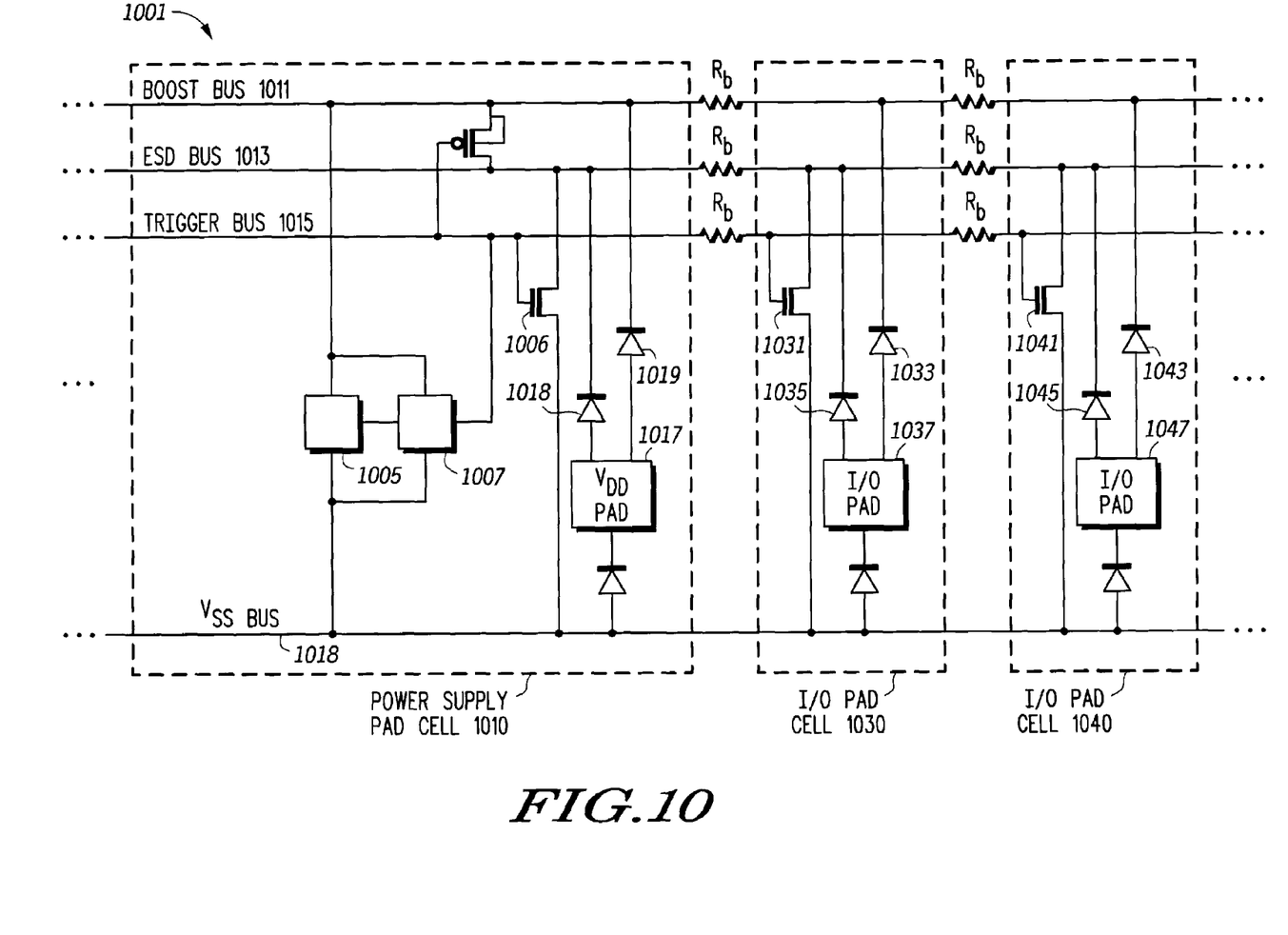
FIG. 10 is a circuit diagram of one embodiment of an implementation of an ESD clamp circuit according to the present invention.

FIG. 10 shows an example of another implementation of a transient detection circuit for ESD protection in an integrated circuit according to the present invention. Circuit 1001 of FIG. 10 includes power supply pad cell 1010 and input/output (I/O) pad cells 1030 and 1040, which include pads 1017, 1037, and 1047, respectively, for external coupling of the integrate circuit chip. Circuit 1001 typically includes other I/O chip pad cells and other power supply pad cells (not shown).

Circuit 1001 includes a transient detection circuit 1005 which is similar to transient detection circuit 405 and an on-time control circuit 1007 which is similar to on-time control circuit 407. The anodes of transient detection circuit 1005 and on-time control circuit 1007 are here connected to a boost bus 1011. The output of on-time control circuit 1007 is connected to a trigger bus 1015. Trigger bus 1015 is connected to the gates of clamp switch transistors 1006, 1031, and 1041 as well as other clamp switch transistors located at other pad cells (not shown). The anodes of clamp switch transistors 1006, 1031, and 1041 are here connected to an ESD bus 1013. The resistors labeled Rb in the boost bus 1011, ESD bus 1013, and trigger bus 1015 represent the distributed resistances of the bus metallization in the integrated circuit.

The ESD bus 1013 provides the main path for the discharge of ESD current during an ESD event. Each of the pads (e.g. 1017, 1037, and 1047) are coupled to the ESD bus 1013 via a diode (e.g. 1018, 1035, and 1045), where the majority of the ESD current from an ESD event at any one pad is discharged through the diode (e.g. 1018, 1035, and 1045) to the ESD bus 1013. Each of the pads are also coupled to the boost bus 1011 via a diode (e.g. 1019, 1033, and 1043). Circuit 1001 shown in FIG. 10 provides ESD protection to VSS for the pads (e.g. 1017, 1037, and 1047) utilizing one set of diodes (e.g. 1018, 1035, and 1045) to couple the ESD waveform to the anodes of transient detection circuit 1005 and on-time control circuit 1007, and another set of diodes (e.g. 1019, 1033, and 1043) to couple the ESD waveform to the anodes of the multiple clamp switch transistors (e.g. 1006, 1031, and 1041). During a positive ESD event applied, for example, to pad 1047 with VSS grounded, diode 1045 will couple the ESD waveform to the ESD bus 1013, while diode 1043 will couple the waveform to the boost bus 1011. When the ESD event is detected on boost bus 1011 by transient detection circuit 1005, on-time control circuit 1007 drives the trigger bus 1015 to the boost bus 1011 voltage to make clamp switch transistors 1006, 1031, and 1041 conductive. The main path for the discharge of the ESD current is then from pad 1047 through diode 1045 to the ESD bus 1013. From the ESD bus, the current flows to VSS parallelly through the multiple clamp switch transistors (1006, 1031, and 1041). During the ESD event, a very small current flows through diode 1043 to the boost bus 1011 as required to power transient detection circuit 1005 and on-time control circuit 1007. Therefore, due to the large difference in current during the ESD event, the voltage drop across diode 1043 coupling pad 1047 to the boost bus 1011 is less than the voltage drop across the diode 1045 coupling each pad to the ESD bus 1013. Thus, the resulting gate voltage at clamp switch transistors 1006, 1031, and 1041 is higher than the voltage of their drains (the voltage of ESD bus 1013). By increasing the gate bias of these clamp switch transistors over their drain voltage, their effective on-resistance is decreased.

Transient detection circuit 1005 and on-time control circuit 1007 may be located at other locations in an IC other than in the power pad cell 1010 as shown in FIG. 10. For example, these circuits may be located in an I/O pad cell (e.g. 1030) or any other convenient location in the integrated circuit chip. In some embodiments, multiple transient detection circuits and on-time control circuits, wired in parallel, may be located around the periphery of an integrated circuit chip.

The circuit of FIG. 10 may also be modified by merging boost bus 1011 into ESD bus 1013 so that the anodes of rise time detection circuit 1005 and on-time control circuit 1007 are connected to the drains of clamp switch transistors 1006, 1031, and 1041 via ESD bus 1013. The transient detection circuits, shown and described herein may be implemented in other types of integrated circuits and in with other types of configurations.

Furthermore, in other embodiments, transient detection circuits shown and described herein may be utilized with other types of on-time control circuits such as e.g. on-time control circuit 107 or other types of conventional on-time control circuits. Furthermore transient detection circuits shown and described herein may be implemented in other types of ESD clamp circuits.

In one aspect of the present invention, a transient detection circuit includes a filter circuit coupled to a first node and a second node. The filter circuit has an output. The transient detection circuit also includes an inverter circuit having an input coupled to the output of the filter circuit. The inverter circuit has a voltage switch point that includes an at least substantially constant voltage offset from the first node.

In another aspect, the present invention includes a circuit for providing electrostatic discharge (ESD) protection for internal components in an integrated circuit during an ESD event. The circuit includes a filter circuit coupled to a first node and to a second node. The filter circuit has an output. The circuit also includes an inverter circuit having an input coupled to the output of the filter circuit. The inverter circuit has a voltage switch point that includes an at least substantially constant voltage offset from the first node. The inverter circuit has an output that is indicative of a detected ESD event. The circuit further includes an on-time control circuit coupled to the output of the inverter circuit. The on-time control circuit has an output to provide a signal for making conductive at least one clamp switch to provide a discharge path for current from an ESD event.

In another aspect, the invention includes a method for detecting a slew rate of a detected voltage between a first node and a second node. The method includes filtering the detected voltage to provide a filtered voltage and providing the filtered voltage as an input to an inverter circuit which has a voltage switch point that includes an at least substantially constant voltage offset from the first node. The method also includes providing an output from the inverter circuit. The output is a function of the slew rate as indicated by the filtered voltage and the voltage switch point.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A transient detection circuit comprising:
   a filter circuit coupled to a first node and a second node, the filter circuit having an output; and
   an inverter circuit having an input coupled to the output of the filter circuit, the inverter circuit having a voltage switch point that includes an at least substantially constant voltage offset from the first node, wherein the at least substantially constant voltage is generated using a resistor coupled between the first node and a p-MOS transistor and a sustantially constant current source coupled between the p-MOS transistor and the second node.

2. The transient detection circuit of claim 1, wherein the filter circuit includes a resistor and a capacitor, the resistor including a first electrode coupled to the first node and a second electrode coupled to the output of the filter circuit, the capacitor including a first electrode coupled to the output and a second electrode coupled to the second node.

3. The transient detection circuit of claim 1 wherein an output of the inverter circuit does not switch output states until the voltage between the first and second nodes exceeds the at least substantially constant voltage offset.

4. The transient detection circuit of claim 1, wherein the inverter circuit includes a first transistor, a second transistor, and a third transistor coupled in series.

5. The transient detection circuit of claim 4, wherein the first transistor includes a first current electrode coupled to the first node and a second current electrode, wherein the second transistor includes a first current electrode coupled to the second current electrode of the first transistor and a second current electrode, and wherein the third transistor includes a first current electrode coupled to the second current electrode of the second transistor and a second current electrode coupled to the second node.

6. The transient detection circuit of claim 5, wherein the second transistor includes a control electrode coupled to the output of the filter circuit.

7. The transient detection circuit of claim 5, wherein the third transistor includes a control electrode coupled to the first node, and wherein the first transistor includes a control electrode coupled to the second current electrode of the first transistor.

8. The transient detection circuit of claim 5 wherein an output of the inverter circuit is connected to the second current electrode of the second transistor and the first current electrode of the third transistor.

9. The transient detection circuit of claim 1, wherein the first node is coupled to receive a first power supply voltage and the second node is coupled to receive a second power supply voltage.

10. The transient detection circuit of claim 9 wherein the first power supply voltage is a positive voltage and the second power supply voltage is ground.

11. A transient detection circuit comprising:
a filter circuit coupled to a first node and a second node, the filter circuit having an output, wherein the first node is coupled to receive a first power supply voltage and the second node is coupled to receive a second power supply voltage, and wherein the first power supply voltage is ground and the second power supply voltage is a positive voltage; and
an inverter circuit having an input coupled to the output of the filter circuit, the inverter circuit having a voltage switch point that includes an at least substantially constant voltage offset from the first node, wherein the at least substantially constant voltage offset is generated using a resistor coupled between the first node and a p-MOS transistor and a substantially constant current source coupled between the p-MOS transistor and the second node.

12. The transient detection circuit of claim 1, wherein the transient detection circuit is included as part of a circuit for providing electrostatic discharge (ESD) protection during an ESD event for components in an integrated circuit chip.

13. An integrated circuit chip including the transient detection circuit of claim 1.

14. The integrated circuit chip of claim 13 further comprising:
an ESD protection circuit, the ESD protection circuit including the transient detection circuit.

15. An ESD circuit for providing ESD protection and including the transient detection circuit of claim 1, the ESD circuit further comprising:
a clamp switch coupled to a third node and coupled to a fourth node, the clamp switch providing a discharge path between the third node and the fourth node for current from an ESD event; and
an on-time control circuit having an input coupled to an output of the inverter circuit and an output coupled to the clamp switch for controlling the conductive state of the clamp switch.

16. The ESD circuit of claim 15 wherein the third node is coupled to the first node and the fourth node is coupled to the second node.

17. The transient detection circuit of claim 1 wherein the inverter circuit is coupled to the first and second nodes to be powered therefrom.

18. A transient detection circuit comprising:
a filter circuit coupled to a first node and a second node, the filter circuit having an output; and
an inverter circuit having an input coupled to the output of the filter circuit, the inverter circuit having a voltage switch point that includes an at least substantially constant voltage offset from the first node, wherein the at least substantially constant voltage offset is generated using a substantially constant current source coupled between the first node and a n-MOS transistor and a resistor coupled between the n-MOS transistor and the second node and wherein the inverter circuit has an output, wherein the output is dependent upon a voltage signal at the first node with respect to the second node having a slew rate greater than a predetermined slew rate.

19. The transient detection circuit of claim 18 wherein the output of the inverter circuit is also dependent upon the first node being at a voltage that is at least higher than a voltage of the second node by the at least substantially constant voltage offset.

20. A circuit for providing electrostatic discharge (ESD) protection during an ESD event for internal components in an integrated circuit, the circuit comprising:
a filter circuit coupled to a first node and to a second node, the filter circuit having an output;
an inverter circuit, having an input coupled to the output of the filter circuit, the inverter circuit having a voltage switch point that includes an at least substantially constant voltage offset from the first node, the inverter circuit having an output that is indicative of a detected ESD event, wherein the inverter circuit further includes a current source and a resistor, wherein the at least substantially constant voltage offset includes a voltage drop across the resistor as set by the current source; and
an on-time control circuit coupled to the output of the inverter circuit, the on-time control circuit having an output to provide a signal for making conductive at least one clamp switch to provide a discharge path for current from an ESD event.

21. The circuit of claim 20 wherein the inverter circuit does not switch output states until the voltage between the first and second nodes exceeds the at least substantially constant voltage offset.

22. The circuit of claim 20 wherein the inverter circuit further includes a transistor, wherein the at least substantially constant voltage offset includes the voltage drop across the resistor and a gate-source voltage of the transistor.

23. The circuit of claim 20 wherein the inverter circuit is coupled to the first and second nodes to be powered therefrom.

24. An integrated circuit chip including the circuit of claim 20 wherein the first node is coupled to a pad of the integrated circuit chip.

25. The integrated circuit chip of claim 24 wherein the pad is a power supply pad.

26. The circuit of claim 20 wherein a clamp switch of the at least one clamp switch has a first current electrode coupled to the first node and a second current electrode coupled to the second node.

* * * * *